US008581767B2

(12) United States Patent
Kato

(10) Patent No.: US 8,581,767 B2
(45) Date of Patent: Nov. 12, 2013

(54) CORRECTION SIGNAL GENERATOR AND ANALOG-TO-DIGITAL CONVERTER

(75) Inventor: Shuichi Kato, Tokyo (JP)

(73) Assignees: Olympus Corporation, Tokyo (JP); Denso Corporation, Kariya-shi, Aichi-ken (JP)

( * ) Notice: Subject to any disclaimer, the term of this patent is extended or adjusted under 35 U.S.C. 154(b) by 263 days.

(21) Appl. No.: 13/243,788

(22) Filed: Sep. 23, 2011

(65) Prior Publication Data

US 2012/0013493 A1 Jan. 19, 2012

Related U.S. Application Data

(63) Continuation of application No. PCT/JP2010/001251, filed on Feb. 24, 2010.

(30) Foreign Application Priority Data

Mar. 30, 2009 (JP) ................................. 2009-083483

(51) Int. Cl.
*H03M 1/12* (2006.01)

(52) U.S. Cl.
USPC ............ 341/155; 341/118; 341/120; 341/143

(58) Field of Classification Search
USPC .................. 341/118, 120, 143, 155
See application file for complete search history.

(56) References Cited

U.S. PATENT DOCUMENTS 5,808,575 A * 9/1998 Himeno et al. ............... 341/139
6,400,301 B1 * 6/2002 Kulhalli et al. ............... 341/155
6,466,151 B2 * 10/2002 Nishii et al. ................... 341/155
6,771,202 B2 * 8/2004 Watanabe et al. ............. 341/155
6,801,146 B2 * 10/2004 Kernahan et al. ............. 341/122
6,842,399 B2 * 1/2005 Harrison ................... 365/189.07
6,861,967 B2 * 3/2005 Tanizawa ...................... 341/118

(Continued)

FOREIGN PATENT DOCUMENTS

JP    5-259907 A    10/1993
JP    2004-274157 A    9/2004

(Continued)

OTHER PUBLICATIONS

Japanese Office Action dated Apr. 16, 2013, issued in corresponding Japanese Patent Application No. 2009-083483, w/ English translation.

(Continued)

*Primary Examiner* — Linh Nguyen
(74) *Attorney, Agent, or Firm* — Westerman, Hattori, Daniels & Adrian, LLP

(57) ABSTRACT

A correction signal generator generates a correction signal that corrects a digital signal obtained from an analog input voltage. The correction signal generator has a correction signal output circuit that holds the number of transit stages of delay units detected by a first stage count detection circuit and a third stage count detection circuit at the timing corresponding to the difference in the number of stages between the number of transit stages of delay units detected by the first stage count detection circuit and the number of transit stages of delay units detected by a second stage count detection circuit, and outputs the difference between the number of stages from the first stage count detection circuit and the number of stages from the third stage count detection circuit, which were held, as the correction signal.

6 Claims, 9 Drawing Sheets

(56) References Cited

U.S. PATENT DOCUMENTS

| | | | |
|---|---|---|---|
| 6,879,278 B2 * | 4/2005 | Watanabe et al. | 341/155 |
| 7,612,699 B2 * | 11/2009 | Tanizawa | 341/157 |
| 7,639,169 B2 * | 12/2009 | Tanizawa | 341/155 |
| 8,005,134 B2 * | 8/2011 | Yamane et al. | 375/232 |
| 2008/0238738 A1 | 10/2008 | Honda et al. | |
| 2008/0284633 A1 | 11/2008 | Tanizawa | |
| 2008/0309542 A1 * | 12/2008 | Tanizawa | 341/163 |

FOREIGN PATENT DOCUMENTS

| | | |
|---|---|---|
| JP | 2005-45538 A | 2/2005 |
| JP | 2006-148678 A | 6/2006 |
| JP | 2008-271489 A | 11/2008 |
| JP | 2008-312184 A | 12/2008 |

OTHER PUBLICATIONS

International Search Report of PCT/JP2010/001251, mailing date Apr. 13, 2010.

* cited by examiner

US 8,581,767 B2

CORRECTION SIGNAL GENERATOR AND ANALOG-TO-DIGITAL CONVERTER

CROSS REFERENCE TO RELATED APPLICATIONS

This application is a continuation application based on a PCT Patent Application No. PCT/JP2010/001251, filed Feb. 24, 2010, whose priority is claimed on Japanese Patent Application No. 2009-083483, filed Mar. 30, 2009, the entire content of which are hereby incorporated by reference.

BACKGROUND OF THE INVENTION

1. Field of the Invention

The present invention relates to a correction signal generator that outputs a correction signal that corrects the linearity of an analog-to-digital (A/D) converter, and an A/D converter that corrects the linearity using the correction signal.

2. Description of the Related Art

In the related art, an A/D converter having a configuration shown in FIG. 9 is known as an A/D converter from which a high-resolution digital value is obtained by a simple configuration (see Japanese Unexamined Patent Application, First Publication No. H5-259907).

In an A/D converter 300 of FIG. 9, a pulse delay circuit 81 has a configuration in which a plurality of delay units NAND1, BUF1, ..., BUF15 each including various gate circuits are connected in a ring shape, and an analog input signal (voltage) Vin serving as an A/D conversion target is supplied as a power supply voltage of each delay unit.

If a circulation pulse SP is input to the pulse delay circuit 81, the circulation pulse SP sequentially passes through each delay unit with a delay time corresponding to the above-described power supply voltage, and circulates within the pulse delay circuit 81.

The number of stages of delay units through which the circulation pulse SP has passed is decided by a delay time of the delay units, that is, the analog input signal Vin supplied as the power supply voltage. A pulse passage stage number detection circuit 82 detects the number of the stages (or the number of circulations).

A latch and encoder 83 receives a detection result of the pulse passage stage number detection circuit 82 at a timing when a latch pulse LP is input after a sampling time of an A/D conversion has elapsed from a start of an input of the circulation pulse SP, and outputs a value obtained by encoding the number of stages through which the circulation pulse SP has passed at the timing as a digital value Cout after the A/D conversion.

Here, because a relationship between the delay time of the delay units and the power supply voltage is not expressed by a linear function in the above-described A/D converter 300, input/output characteristics indicating a relationship between the analog input signal Vin and the digital value Cout, which is the A/D conversion result, is shown in a curve. As a method of approximating the input/output characteristics to an ideal straight line, an A/D conversion result is obtained by pre-dividing a voltage range of an analog input signal, which is an A/D conversion target, into a plurality of regions. A process of obtaining an approximation equation that connects values obtained as A/D conversion results by a straight line and correcting a digital value generated by actually performing an A/D conversion from a coordinate point obtained from the approximation equation has been proposed (see Japanese Unexamined Patent Application, First Publication No. 2004-274157).

However, there is a problem in that setting a conversion equation is complex because it is necessary to actually perform A/D conversions for a number of reference voltages, obtain A/D conversion data in coordinate points corresponding to the reference voltages, and set the conversion equation using a number of obtained A/D conversion data so as to obtain the conversion equation for approximately correcting data after the A/D conversions.

SUMMARY

The present invention provides a correction signal generator capable of easily correcting input/output characteristics of an A/D converter without actually performing A/D conversions for a number of reference voltages by generating a correction signal, which corrects the input/output characteristics of the A/D converter.

Also, the present invention provides an A/D converter that obtains input/output characteristics close to an ideal straight line by correcting a digital value after an A/D conversion using the above-described correction signal.

A correction signal generator may generate a correction signal that corrects a digital signal obtained from an analog input voltage. The correction signal generator may include: a first stage number detection circuit including a first pulse delay circuit and a first pulse passage stage number detection circuit, a plurality of stages of delay units each of which delays a first pulse signal by a delay time corresponding to a magnitude of the analog input voltage being connected in the first pulse delay circuit, the first pulse passage stage number detection circuit detecting the number of stages of delay units in the first pulse delay circuit through which the first pulse signal has passed; a level shift circuit configured to output an analog voltage obtained by shifting a voltage level of the analog input voltage; a second stage number detection circuit including a second pulse delay circuit and a second pulse passage stage number detection circuit, a plurality of stages of delay units that delays a second pulse signal by a delay time corresponding to a magnitude of the analog voltage with the voltage level shifted by the level shift circuit being connected in the second pulse delay circuit, the second pulse passage stage number detection circuit detecting the number of stages of delay units in the second pulse delay circuit through which the second pulse signal has passed; a third stage number detection circuit including a third pulse delay circuit and a third pulse passage stage number detection circuit, a plurality of stages of delay units that delays a third pulse signal by a delay time corresponding to a magnitude of a first analog reference voltage, which is a first prescribed voltage value, being connected in the third pulse delay circuit, the third pulse passage stage number detection circuit detecting the number of stages of delay units in the third pulse delay circuit through which the third pulse signal has passed; and a correction signal output circuit configured to retain the number of passage stages of delay units detected by the first stage number detection circuit and the third stage number detection circuit at a timing corresponding to a stage number difference between the number of passage stages of delay units detected by the first stage number detection circuit and the number of passage stages of delay units detected by the second stage number detection circuit, the correction signal output circuit outputting a difference between the number of stages from the first stage number detection circuit and the number of stages from the third stage number detection circuit retained as a correction signal.

The correction signal output circuit may retain the number of stages of delay units detected by the first stage number detection circuit at a timing when the stage number difference between the number of passage stages of delay units detected by the first stage number detection circuit and the number of passage stages of delay units detected by the second stage number detection circuit becomes a prescribed stage number difference.

An analog-to-digital (A/D) converter may convert an analog input voltage into a digital signal. The A/D converter may include: a fourth stage number detection circuit including a fourth pulse delay circuit and a fourth pulse passage stage number detection circuit, a plurality of stages of delay units that delays a fourth pulse signal by a delay time corresponding to a magnitude of the analog input voltage being connected in the fourth pulse delay circuit, the fourth pulse passage stage number detection circuit detecting the number of stages of delay units in the fourth pulse delay circuit through which the fourth pulse signal has passed in a predetermined time; a fifth stage number detection circuit including a fifth pulse delay circuit and a fifth pulse passage stage number detection circuit, a plurality of stages of delay units that delays a fifth pulse signal by a delay time corresponding to a magnitude of a second analog reference voltage, which is a prescribed second voltage value, being connected in the fifth pulse delay circuit, the fifth pulse passage stage number detection circuit detecting the number of stages of delay units in the fifth pulse delay circuit through which the fifth pulse signal has passed in the predetermined time; an output circuit configured to subtract the number of passage stages of delay units detected by the fifth stage number detection circuit from the number of passage stages of delay units detected by the fourth stage number detection unit, the output circuit outputting a subtraction result of the number of passage stages of delay units as a digital signal; the correction signal generator according to claim 1; and a correction circuit configured to correct a digital signal output from the output circuit based on the correction signal output from the correction signal generator and outputting the corrected digital signal.

The correction circuit may average the correction signal output from the correction signal generator and the digital signal output from the output circuit, and outputs an averaged digital signal.

The second analog reference voltage may be equal to the first analog reference voltage.

The A/D converter may further include: a timer circuit configured to set the predetermined time so that the number of passage stages of delay units detected by the fifth stage number detection circuit is substantially equal to the number of stages from the third stage number detection circuit retained by the correction signal output circuit if the second analog reference voltage is equal to the first analog reference voltage and the analog input voltage.

According to the present invention, it is possible to provide a correction signal generator that generates a correction signal for correcting a curvature (nonlinearity) of input/output characteristics of an A/D converter, and easily transform input/output characteristics of an A/D converter of the related art into characteristics close to an ideal straight line by correcting a digital signal output value after an A/D conversion on the basis of the correction signal.

DETAILED DESCRIPTION OF THE PREFERRED EMBODIMENTS

The present invention will be now described herein with reference to illustrative embodiments. Those skilled in the art will recognize that many alternative embodiments can be accomplished using the teaching of the present invention and that the present invention is not limited to the embodiments illustrated for explanatory purpose.

First Embodiment

Figure 1:
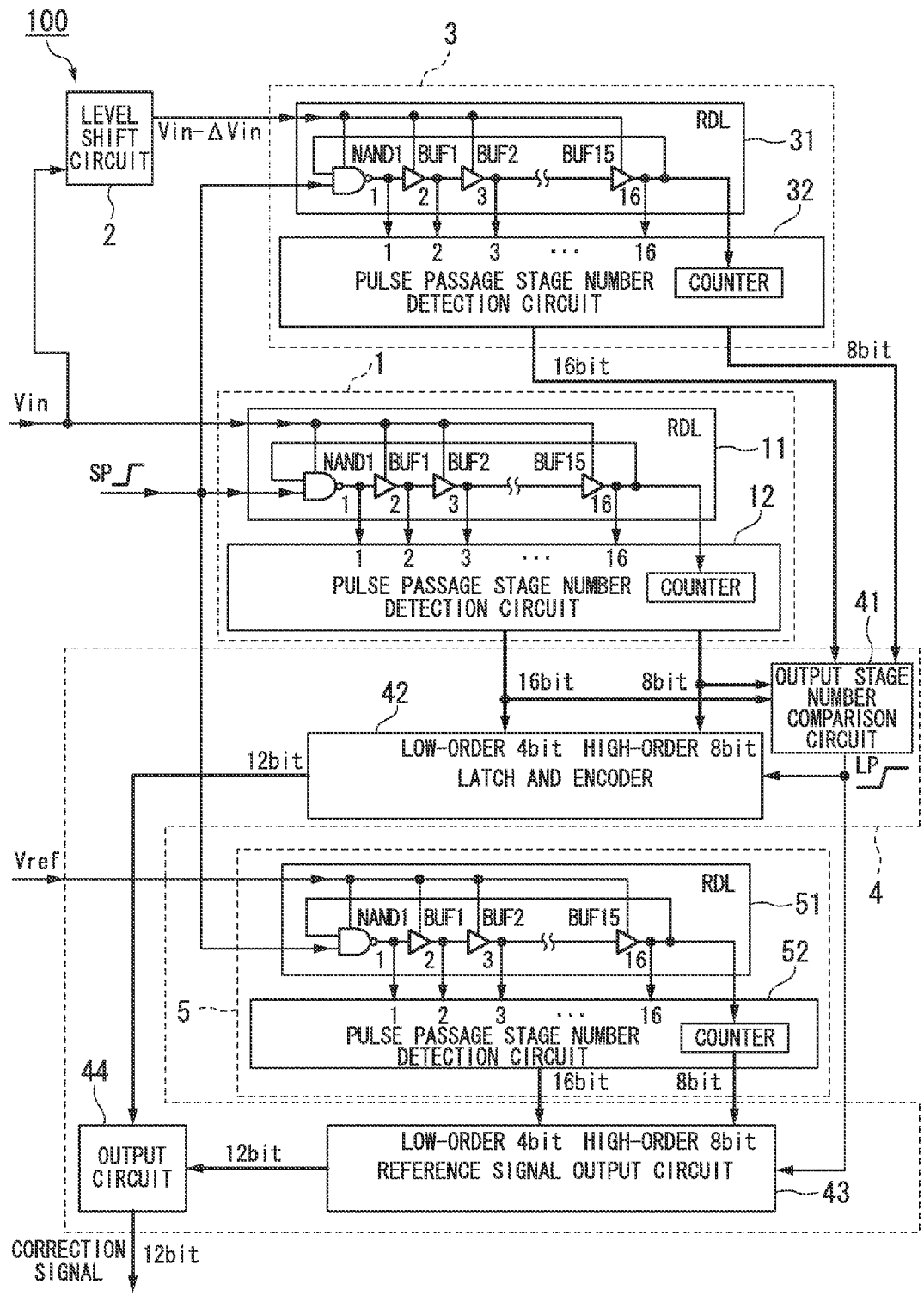
FIG. 1 is a block diagram showing a configuration of a correction signal generator according to an embodiment of the present invention.

FIG. 1 is a block diagram showing a configuration of a correction signal generator according to this embodiment. In FIG. 1, the correction signal generator 100 includes a stage number detection circuit 1, a level shift circuit 2, a stage number detection circuit 3, a correction signal output circuit 4, and a stage number detection circuit 5. The stage number detection circuit 1 includes a pulse delay circuit 11 and a pulse passage stage number detection circuit 12. The stage number detection circuit 3 includes a pulse delay circuit 31 and a pulse passage stage number detection circuit 32. The correction signal output circuit 4 includes an output stage number comparison circuit 41, a latch and encoder 42, a reference signal output circuit 43, and an output circuit 44. The stage number detection circuit 5 includes a pulse delay circuit 51 and a pulse passage stage number detection circuit 52.

The stage number detection circuit 1 outputs a signal indicating a delay time of a circulation pulse SP corresponding to a voltage level (voltage value) of an analog input voltage Vin.

The pulse delay circuit 11 has a configuration in which 16-stage gate circuits (hereinafter referred to as "delay units") with a delay amount corresponding to a power supply voltage are connected in a ring shape, and is a ring delay line (RDL) that causes the circulation pulse SP to be circulated by the above-described configuration.

A first-stage delay unit NAND1 has one input terminal to which the circulation pulse SP is input and the other input terminal to which an output of a sixteenth-stage delay unit BUF15 is input, and is constituted by a gate circuit (for example, a NAND gate), which logically inverts an output of the sixteenth-stage delay unit BUF15 constantly when the pulse delay circuit 11 is in operation.

Each of a second-stage delay unit BUF1 to the sixteenth-stage delay unit BUF15 is constituted by a gate circuit that outputs a value input to an input terminal to an output terminal (for example, a buffer circuit in which two stages of NOT gates are connected).

An analog input voltage Vin is applied to the delay units NAND1, BUF1, . . . , BUF15 as a power supply voltage. Each delay unit outputs the circulation pulse SP input from a previous-stage delay unit to a next-stage delay unit with a delay time corresponding to a voltage level of the power supply voltage (analog input voltage Vin). The delay units connected in the ring shape equally operate and the circulation pulse SP is transferred sequentially from the previous-stage delay unit to the next-stage delay unit, so that the circulation pulse SP circulates within the pulse delay circuit 11.

A process in which the circulation pulse SP circulates within the pulse delay circuit 11 will be specifically described as follows.

When no circulation pulse SP is input to the one input terminal of the first-stage delay unit (when the circulation pulse SP has an "L" level), an output terminal of the delay unit NAND1 has an "H" level regardless of an input of the other input terminal, and output terminals of the second-stage delay unit BUF1 and the subsequent delay units also have the "H" level.

If the circulation pulse SP is input to the one input terminal of the delay unit NAND1 (or the circulation pulse SP has the "H" level), the output terminal of the delay unit NAND1 is switched to the "L" level with a delay time corresponding to the voltage level of the power supply voltage (analog input voltage Vin) by the input of the circulation pulse SP because the other input terminal receives an input of the "H" level output from the last-stage delay unit BUF15. Thereafter, the output terminals of the second-stage delay unit BUF1 and the subsequent delay units are also sequentially switched to the "H" level with the delay time corresponding to the voltage level of the power supply voltage (analog input voltage Vin).

If the output terminal of the last-stage delay unit BUF15 is switched to the "L" level, the output terminal of the first-stage delay unit NAND1 is switched to the "H" level with the delay time corresponding to the voltage level of the power supply voltage (analog input voltage Vin) because an output of the last-stage delay unit BUF15 is input to the input terminal of the first-stage delay unit NAND1. Thereafter, the output terminals of the second-stage delay unit BUF1 and the subsequent delay units are also sequentially switched to the "H" level with the delay time corresponding to the voltage level of the power supply voltage (analog input voltage Vin).

If the output terminal of the last-stage delay unit BUF15 is switched to the "H" level, the output terminal of the first-stage delay unit NAND1 is switched to the "L" level in the next circulation. Thereafter, the output terminals of the second-stage delay unit BUF1 and the subsequent delay units are also sequentially switched to the "L" level.

Thereafter, while the circulation pulse SP is input, an operation is iterated in which the output terminals of the delay units BUF1, . . . , BUF15 are sequentially switched to an inverted output level after the first-stage delay unit NAND1 by switching of the output terminal of the last-stage delay unit BUF15, and consequently, the circulation pulse SP continuously circulates within the pulse delay circuit 11.

Because a delay time from when the input terminal level of each delay unit is switched to when the output terminal level is switched is a time corresponding to the analog input voltage Vin, which is the power supply voltage of each delay unit, the number of stages of delay units through which the circulation pulse SP has passed to circulate within the pulse delay circuit 11 within a certain predetermined time depends on the analog input voltage Vin.

The pulse passage stage number detection circuit 12 is a circuit that detects the number of stages of delay units in the pulse delay circuit 11 through which the circulation pulse SP has passed.

An output signal of each delay unit of the pulse delay circuit 11 is input to the pulse passage stage number detection circuit 12.

The pulse passage stage number detection circuit 12 outputs a counting result of a counter that counts the number of times that the output terminal of the sixteenth delay unit BUF15 is switched from the "H" level to the "L" level or from the "L" level to the "H" level as an 8-bit count value, and also outputs 16-bit data indicating each state of the "H" level or the "L" level input from each of the 16-stage delay units of the pulse delay circuit 11.

Here, the above-described 8-bit count value and 16-bit data output from the pulse passage stage number detection circuit 12 indicate how many times the circulation pulse SP has circulated within the pulse delay circuit 11 and what stage delay unit the circulation pulse SP has reached.

For example, if the above-described count value is 4, the output of the fifth-stage delay unit BUF4 has the "L" level, and the output of the sixth-stage delay unit has the "H" level, the number of stages of delay units through which it has passed becomes 69 (16 stages×4 times+5 stages=69 stages).

As described above, the stage number detection circuit 1 outputs the number of stages of delay units in the pulse delay circuit 11 through which the circulation pulse SP has passed in which the analog input voltage Vin is designated as the power supply voltage as digital data of 8 bits+16 bits (hereinafter referred to as "first passage stage number data").

The level shift circuit 2 outputs a level shift voltage Vin−ΔVin obtained by level-shifting the analog input voltage Vin by a prescribed fixed small voltage value ΔVin. The level shift voltage serves as the power supply voltage of the delay unit in the stage number detection circuit 3.

The level shift voltage is the prescribed fixed small voltage value ΔVin less than the analog input voltage Vin in this embodiment, but the level shift voltage may be a voltage Vin+ΔVin, which is the prescribed fixed small voltage value ΔVin greater than the analog input voltage Vin.

According to a voltage level of the level shift voltage Vin−ΔVin from the level shift circuit 2, the stage number detection circuit 3 outputs the number of passage stages of delay units through which the circulation pulse SP circulates as digital data of 8 bits+16 bits (hereinafter referred to as "second passage stage number data").

Also, the stage number detection circuit 3 has the same configuration as the stage number detection circuit 1 and performs an operation similar to the stage number detection circuit 1, except that the power supply voltage of the pulse delay circuit 31 is the level shift voltage Vin−ΔVin.

Accordingly, a difference between the first passage stage number data output by the stage number detection circuit 1 and the second passage stage number data output by the stage number detection circuit 3 is a value corresponding to the number of passage stages of delay units based on the prescribed fixed small voltage value ΔVin.

According to a voltage level of an analog reference voltage Vref, which is a prescribed constant voltage level, the stage number detection circuit 5 outputs the number of passage stages of delay units through which the circulation pulse SP circulates as digital data of 8 bits+16 bits (hereinafter referred to as "third passage stage number data"). Also, the stage number detection circuit 5 has the same configuration as the stage number detection circuits 1 and 3 and performs an operation similar to the stage number detection circuits 1 and 3, except that the power supply voltage of the pulse delay circuit 51 is the analog reference voltage Vref.

The correction signal output circuit 4 outputs a difference between the first passage stage number data and the third passage stage number data as a correction signal at the timing when a difference between the first passage stage number data and the second passage stage number data reaches a prescribed value.

Specifically, the output stage number comparison circuit 41 compares a difference between the first passage stage number data output from the stage number detection circuit 1 and the second passage stage number data output from the stage number detection circuit 3, and outputs a latch pulse LP when the difference reaches a prescribed difference (passage delay-unit stage number difference). The latch pulse LP indicates the timing when the latch and encoder 42 retains (latches) the first passage stage number data and the reference signal output circuit 43 retains (latches) the third passage stage number data.

The latch and encoder 42 latches the first passage stage number data at the timing of the latch pulse LP input from the output stage number comparison circuit 41, encodes the latched first passage stage number data into a 12-bit digital signal, and outputs the 12-bit digital signal as a detection signal.

The reference signal output circuit 43 latches the third passage stage number data at the timing of the latch pulse LP input from the output stage number comparison circuit 41, encodes the latched third passage stage number data into a 12-bit digital signal, and then outputs the 12-bit digital signal as a reference signal. Also, the reference signal output circuit 43 has the same configuration as the latch and encoder 42 and performs an operation similar to the latch and encoder 42, except that the latched digital signal becomes the third passage stage number data.

The output circuit 44 subtracts the reference signal output by the reference signal output circuit 43 from the detection signal output by the latch and encoder 42, and outputs a signal subtraction result as a correction signal.

A voltage level (fixed voltage value) of the analog reference voltage Vref is not specially limited in the correction signal generator 100 of this embodiment, but it is preferable to set the analog reference voltage Vref to a voltage level that is equal or close to a minimum voltage value of an input voltage range of the analog input voltage Vin. This is because the voltage level of the analog reference voltage Vref is a voltage based on the correction signal output by the correction signal generator of this embodiment according to the analog input voltage Vin, so that it is possible to decide the origin of the correction signal (or a point at which output data becomes "0" when the analog input voltage Yin has the same voltage level as the analog reference voltage Vref: the origin of the graphs in FIGS. 3 and 7 to be described later) by the voltage level of the analog reference voltage Vref, and because it is possible to widely secure an input voltage range of the analog voltage Vin when the voltage level of the analog reference voltage Vref is close to the minimum voltage value of the input voltage range of the analog input voltage Vin. In the following description, the voltage level of the analog reference voltage Vref will be described as the minimum voltage value of the input voltage range of the analog input voltage Vin. Also, in the following description, the expression "based on the voltage level of the analog reference voltage Vref" means "based on the origin."

Figure 2:
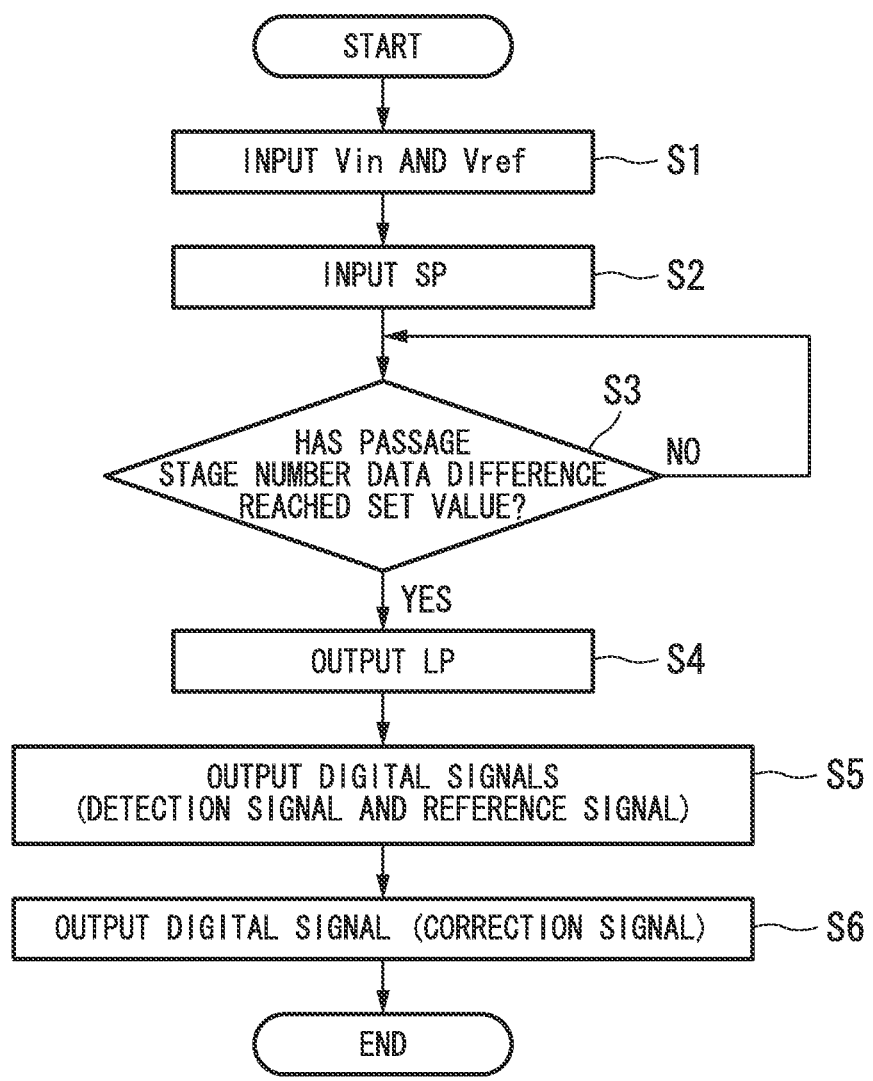
FIG. 2 is a flowchart showing a processing procedure in the correction signal generator according to an embodiment of the present invention.

Next, a processing procedure of the correction signal generator will be described. FIG. 2 is a flowchart showing a processing procedure in the correction signal generator 100 according to this embodiment.

First, in step S1, the analog input voltage Vin is input to the pulse delay circuit 11 and the level shift circuit 2. Thereby, the level shift voltage Vin−ΔVin is input to the pulse delay circuit 31. The analog reference voltage Vref is input to the pulse delay circuit 51.

Subsequently, in step S2, the circulation pulse SP is input to the pulse delay circuits 11, 31, and 51. Thereby, the circulation pulse SP circulates within the delay units in different delay times in the pulse delay circuits 11, 31, and 51 (or in a delay time corresponding to a voltage level of the analog input voltage Vin in the pulse delay circuit 11, a delay time corresponding to a voltage level of the level shift voltage Vin−ΔVin in the pulse delay circuit 31, and a delay time corresponding to a voltage level of the analog reference voltage Vref in the pulse delay circuit 51). The pulse passage stage number detection circuits 12, 32, and 52 detect the number of stages of delay units through which the circulation pulse SP has passed, and output detection results as the first, second, and third passage stage number data, respectively.

Subsequently, in step S3, the output stage number comparison circuit 41 compares a difference (passage delay-unit stage number difference) between the first passage stage number data and the second passage stage number data output from the pulse passage stage number detection circuits 12 and 32, and determines whether or not the difference has reached a preset value (set value). If the passage stage number data difference has reached the set value, the output stage number comparison circuit 41 outputs a latch pulse LP for enabling the latch and encoder 42 to latch the first passage stage number data and enabling the reference signal output circuit 43 to latch the third passage stage number data in step S4. If the passage stage number data difference does not reach the set value, step S3 is iterated.

Subsequently, in step S5, the latch and encoder 42 latches the first passage stage number data according to the latch pulse LP input from the output stage number comparison circuit 41, encodes the first passage stage number data into a 12-bit digital signal, and outputs the 12-bit digital signal as a detection signal. Also, in step S5, the reference signal output circuit 43 latches the third passage stage number data according to the latch pulse LP input from the output stage number comparison circuit 41, encodes the third passage stage number data into a 12-bit reference signal, and outputs the 12-bit reference signal.

Subsequently, in step S6, the output circuit 44 outputs a correction signal by subtracting the reference signal output from the reference signal output circuit 43 from the detection signal output from the latch and encoder 42. The processing is then completed.

Figure 3:
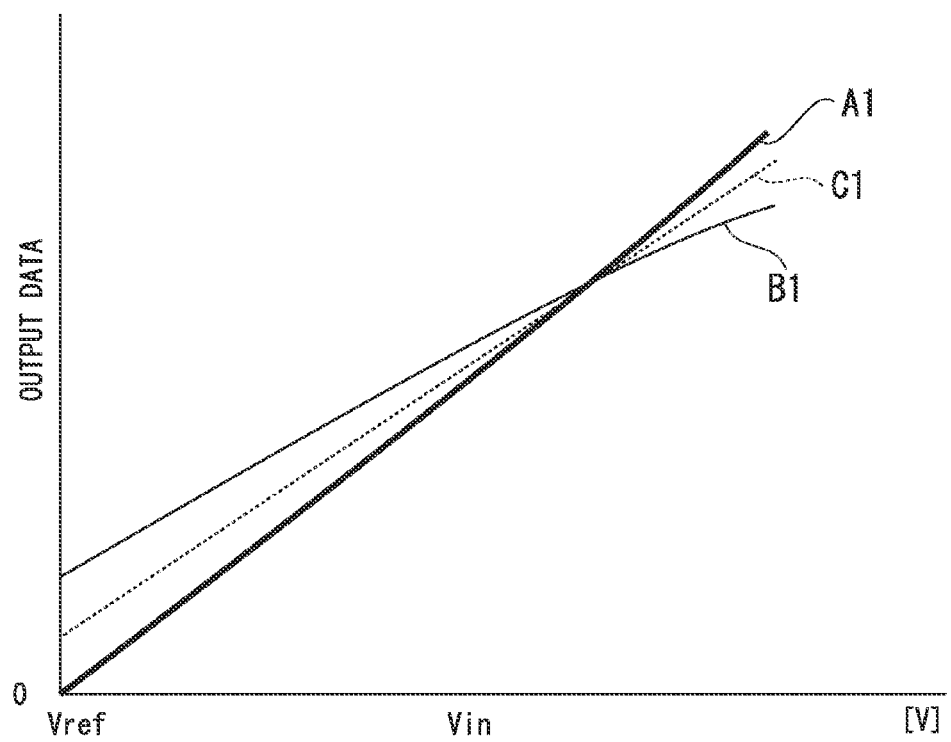
FIG. 3 is a graph showing an example of input/output characteristics of the correction signal generator according to an embodiment of the present invention.

Next, the input/output characteristics of the correction signal generator according to the above-described configuration will be described. FIG. 3 is a graph showing an example of the input/output characteristics of the correction signal generator 100 according to this embodiment and an example of the input/output characteristics of the A/D converter 300 before a correction in the related art shown in FIG. 9. In FIG. 3, an X axis represents an analog input voltage Vin, and a Y axis represents digital signals output from the correction signal generator 100 and the A/D converter 300 of the related art. In FIG. 3, a curve "A1" represents the input/output characteristics (correction signal) of the correction signal generator 100, and a curve "B1" represents the input/output characteristics (digital value Cout in FIG. 9) of the A/D converter 300 of the related art. A straight line "C1" shown in FIG. 3 represents data obtained by averaging the correction signal of the curve "A1" and the digital value Cout of the curve "B1."

As shown in FIG. 3, the input/output characteristics of the A/D converter 300 of the related art are expressed by a curve like the curve "B1," not a straight line corresponding to the analog input voltage Vin. This is because a change in the number of stages of delay units through which the circulation pulse SP has passed to circulate within the pulse delay circuit 81 during a certain time is smaller than a change in the voltage level of the analog input voltage Vin, and therefore a change in the output digital value Cout is small.

The input/output characteristics of the correction signal generator 100 according to this embodiment become characteristics having a curvature direction opposite to that of the input/output characteristics of the A/D converter 300 of the related art, as shown in the curve "A1." This is because the correction signal generator 100 fixes a slope in a small voltage range for an input voltage (or a slope from the level shift voltage Vin−ΔVin to the analog input voltage Vin) by fixing a difference ΔCount of the number of stages of delay units through which the circulation pulse SP has passed to circulate within the pulse delay circuit 11 with respect to a constant voltage level ΔVin, which is a difference between the analog input voltage Vin and the level shift voltage Vin−ΔVin, and delays the timing of outputting the latch pulse LP (or lengthens a sampling time) by an extent to which the slope of the input/output characteristics B1 of the A/D converter 300 of the related art is reduced.

Figure 4:
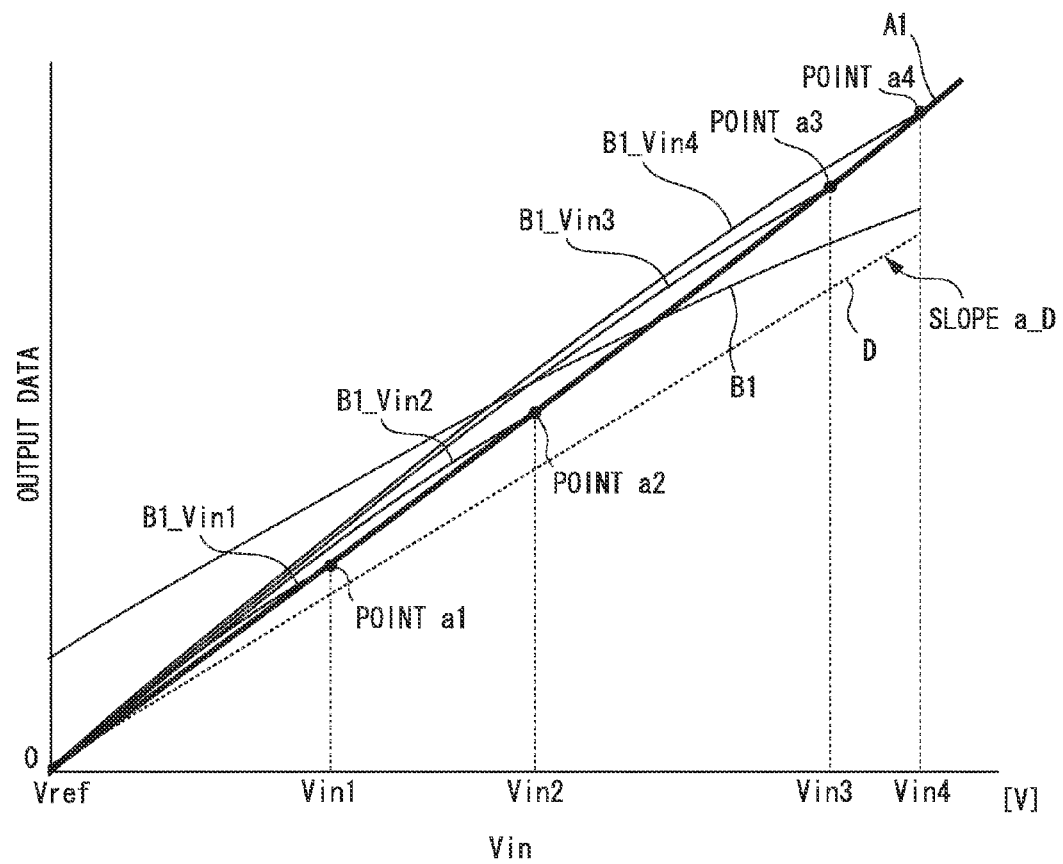
FIG. 4 is a graph showing a detailed example of the input/output characteristics of the correction signal generator according to an embodiment of the present invention.

Here, the input/output characteristics of the correction signal generator 100 will be described in further detail using FIG. 4. In FIG. 4, a straight line "D" has a fixed slope a_D (ΔCout/ΔVin). A curve "B1_Vin4" is based on the origin which is the input/output characteristics when a sampling time is a time when the slope becomes a_D at the analog input voltage Vin=Vin4 in the A/D converter 300 of the related art. Likewise, a curve "B1_Vin3" is based on the origin which is the input/output characteristics when a sampling time is a time when the slope becomes a_D at the analog input voltage Vin=Vin3 in the A/D converter 300 of the related art, a curve "B1_Vin2" is based on the origin which is the input/output characteristics when the sampling time is a time when the slope becomes a_D at the analog input voltage Vin=Vin2 in the A/D converter 300 of the related art, and a curve "B1_Vin1" is based on the origin which is the input/output characteristics when the sampling time is a time when the slope becomes a_D at the analog input voltage Vin=Vin1 in the A/D converter 300 of the related art.

That is, the input/output characteristics of the correction signal generator 100 become a curve as shown in the curve "A1" passing through the origin, a point a1 at which the analog input voltage Vin=Vin1 in the curve "B1_Vin1," a point a2 at which the analog input voltage Vin=Vin2 in the curve "B1_Vin2," a point a3 at which the analog input voltage Vin=Vin3 in the curve "B1_Vin3," and a point a4 at which the analog input voltage Vin=Vin4 in the curve "B1_Vin4."

As described above, the input/output characteristics of the correction signal generator 100 are the origin which is the input/output characteristics of the A/D converter 300 of the related art and the sampling time differs according to a magnitude of the input voltage, so that the input/output characteristics of the correction signal generator 100 become characteristics having a curvature direction opposite to that of the input/output characteristics of the A/D converter 300 of the related art.

As a result, the input/output characteristics of the A/D converter 300 of the related art shown in the curve "B1" are corrected (or averaged in FIG. 3) using input/output characteristics (correction signals) output by the correction signal generator 100 shown in the curve "A1," so that a result of input/output characteristics close to an ideal straight line required for the A/D converter as shown in the straight line "C1" of FIG. 3 can be obtained.

As described above, according to the correction signal generator of this embodiment, it is possible to generate the correction signal that is the input/output characteristics having a curvature direction opposite to that of the input/output characteristics of the A/D converter of the related art, which converts an analog input voltage into digital data using the pulse delay circuit that delays the circulation pulse by a delay time corresponding to a magnitude of the analog input voltage. Using the generated correction signal, it is possible to easily correct digital data output by the A/D converter and implement the A/D converter having input/output characteristics with a good linearity.

In the A/D converter of the related art, it is necessary to decide a time (sampling time) from when the circulation pulse SP is input to when the latch pulse LP is input from an outside with a high accuracy. On the other hand, in the correction signal generator of this embodiment, it is possible to easily implement a highly accurate A/D converter without having to input a highly accurate pulse signal from the outside because the latch pulse LP is automatically generated.

Second Embodiment

Figure 5:
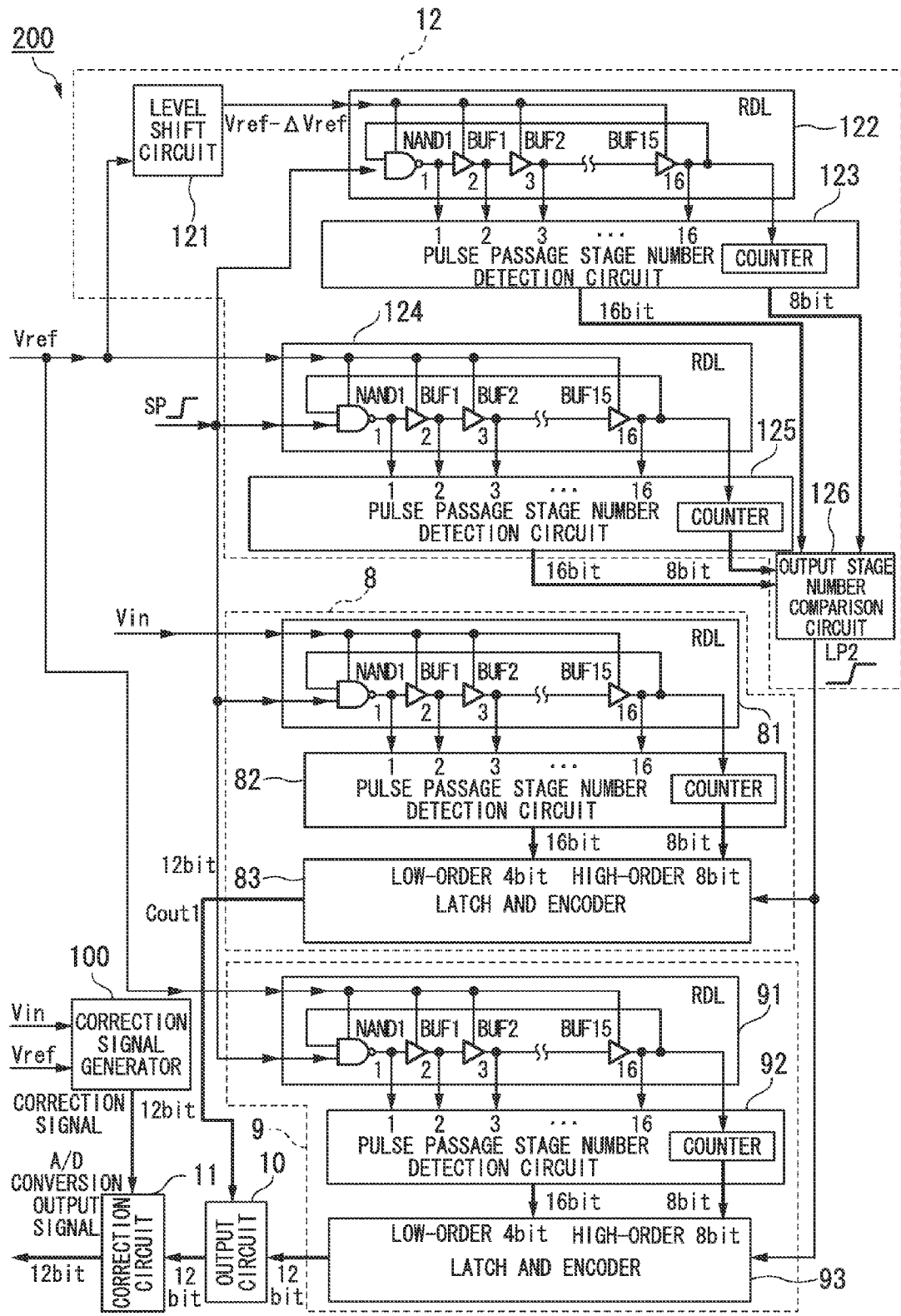
FIG. 5 is a block diagram showing a configuration of an A/D converter according to an embodiment of the present invention.

Hereinafter, the second embodiment of the present invention will be described with reference to the drawings. FIG. 5 is a block diagram showing a configuration of an A/D converter according to this embodiment. In FIG. 5, an A/D converter 200 includes a stage number detection circuit 8, a stage number detection circuit 9, an output circuit 10, a correction signal generator 100, a correction circuit 11, and a timer circuit 12. The correction signal generator 100 is the correction signal generator 100 shown in the first embodiment described above. The stage number detection circuit 8 includes a pulse delay circuit 81, a pulse passage stage number detection circuit 82, and a latch and encoder 83. The stage number detection circuit 9 includes a pulse delay circuit 91, a pulse passage stage number detection circuit 92, and a latch and encoder 93.

An analog reference voltage Vref in the A/D converter 200 of this embodiment will be described as having the same voltage level in all circuits to which the analog reference voltage Vref is input, and its voltage value as being a minimum voltage value of an input voltage range of an analog input voltage Vin. Likewise, the analog input voltage Vin will also be described as being identical in all circuits to which the analog input voltage Vin is input.

The stage number detection circuit 8 encodes digital data (hereinafter referred to as "fourth passage stage number data") indicating the number of passage stages of delay units through which the circulation pulse SP circulates into a 12-bit digital signal according to a voltage level of the analog input voltage Vin, and outputs the 12-bit digital signal as a first output signal Cout1. The pulse delay circuit 81, the pulse passage stage number detection circuit 82, and the latch and encoder 83 of the stage number detection circuit 8 respectively have the same configurations and operations as the pulse delay circuit 11, the pulse passage stage number detection circuit 12, and the latch and encoder 42 shown in FIG. 1, except that the pulse passage stage number detection circuit 82 latches the number of passage stages of delay units within the pulse delay circuit 81 at the timing of a latch pulse LP2. Here, the latch pulse LP2 is a pulse signal that is output when a certain time has elapsed after the circulation pulse SP is input, without depending on the analog input voltage Vin.

Figure 9:
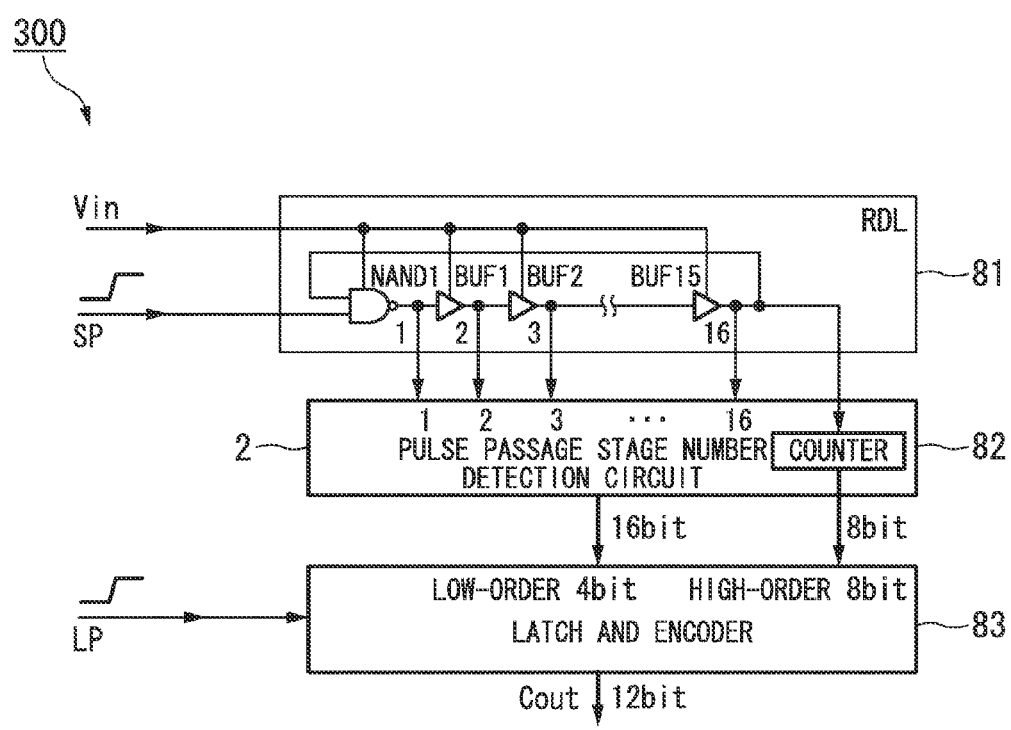
FIG. 9 is a block diagram showing a configuration of an A/D converter of the related art.

The stage number detection circuit 8 has the same function as the A/D converter 300 of the related art shown in FIG. 9, and the first output signal Cout1 has the same value as a digital value Cout into which the A/D converter 300 of the related art shown in FIG. 9 performs a digital conversion.

The stage number detection circuit 9 encodes digital data (hereinafter referred to as "fifth passage stage number data") indicating the number of passage stages of delay units through which the circulation pulse SP circulates into a 12-bit digital signal according to the voltage level of the analog input voltage Vin, and outputs the 12-bit digital signal as a second reference signal. The stage number detection circuit 9 has the same configuration as the stage number detection circuit 81 and performs an operation similar to the stage number detection circuit 81, except that a power supply voltage of the pulse delay circuit 81 is the analog reference voltage Vref.

The timer circuit 12 outputs the latch pulse LP2 when a certain time has elapsed after the circulation pulse SP is input.

As shown in FIG. 5, the timer circuit 12 includes, for example, a level shift circuit 121, a pulse delay circuit 122, a pulse passage stage number detection circuit 123, a pulse delay circuit 124, a pulse passage stage number detection circuit 125, and an output stage number comparison circuit 126. Hereinafter, digital data indicating the number of passage stages of delay units detected by the pulse passage stage number detection circuit 123 is referred to as "sixth passage stage number data." Also, digital data indicating the number of passage stages of delay units detected by the pulse passage stage number detection circuit 125 is referred to as "seventh passage stage number data." In this case, the level shift circuit 121, the pulse delay circuit 122, the pulse passage stage number detection circuit 123, the pulse delay circuit 124, the pulse passage stage number detection circuit 125, and the output stage number comparison circuit 126 have the same configurations and operations as the level shift circuit 2, the pulse delay circuit 31, the pulse passage stage number detection circuit 32, the pulse delay circuit 11, the pulse passage stage number detection circuit 12, and the output stage number comparison circuit 41 shown in FIG. 1, respectively, except that voltages input to the level shift circuit 121 and the pulse delay circuit 124 are the analog reference voltage Vref. The level shift circuit 121 outputs a level shift reference voltage Vref−ΔVref obtained by level-shifting the analog input voltage Vref by a prescribed fixed small voltage value ΔVref (only ΔVref=ΔVin). That is, because the analog reference voltage Vref is at a constant voltage level, the level shift reference voltage Vref−ΔVref also becomes at a constant voltage level.

Accordingly, a difference between the sixth passage stage number data output by the pulse passage stage number detection circuit 123 and the seventh passage stage number data output by the pulse passage stage number detection circuit 125 becomes a fixed value corresponding to the number of passage stages of delay units based on the prescribed fixed small voltage value ΔVref.

Thereby, the latch pulse LP2 output from the output stage number comparison circuit 126 becomes a pulse signal that is output when a certain time has elapsed (for example, a time having the same value as a difference in the number of passage stages of delay units passage the output stage number comparison circuit 41) after the circulation pulse SP is input.

The output circuit 10 subtracts the second reference signal output by the stage number detection circuit 9 from the first output signal Cout1 output by the stage number detection circuit 8, and outputs an output signal of a subtraction result as a second output signal into which the A/D converter 200 of this embodiment performs a conversion according to the analog input voltage Vin. As in the description of the output circuit 44 according to the first embodiment, the second output signal output by the output circuit 10 becomes a 12-bit output signal based on the origin which is the first output signal Cout1 output by the stage number detection circuit 8.

The second output signal output by the output circuit 10 is also referred to as a digital value based on the origin which is the digital value Cout into which the A/D converter 300 of the related art shown in FIG. 9 performs a conversion.

The correction circuit 11 averages the correction signal output from the correction signal generator 100 and the second output signal output from the output circuit 10, and outputs an output signal of an average result as a final 12-bit digital value (A/D conversion output signal) into which the A/D converter 200 of this embodiment performs a digital conversion.

Figure 6:
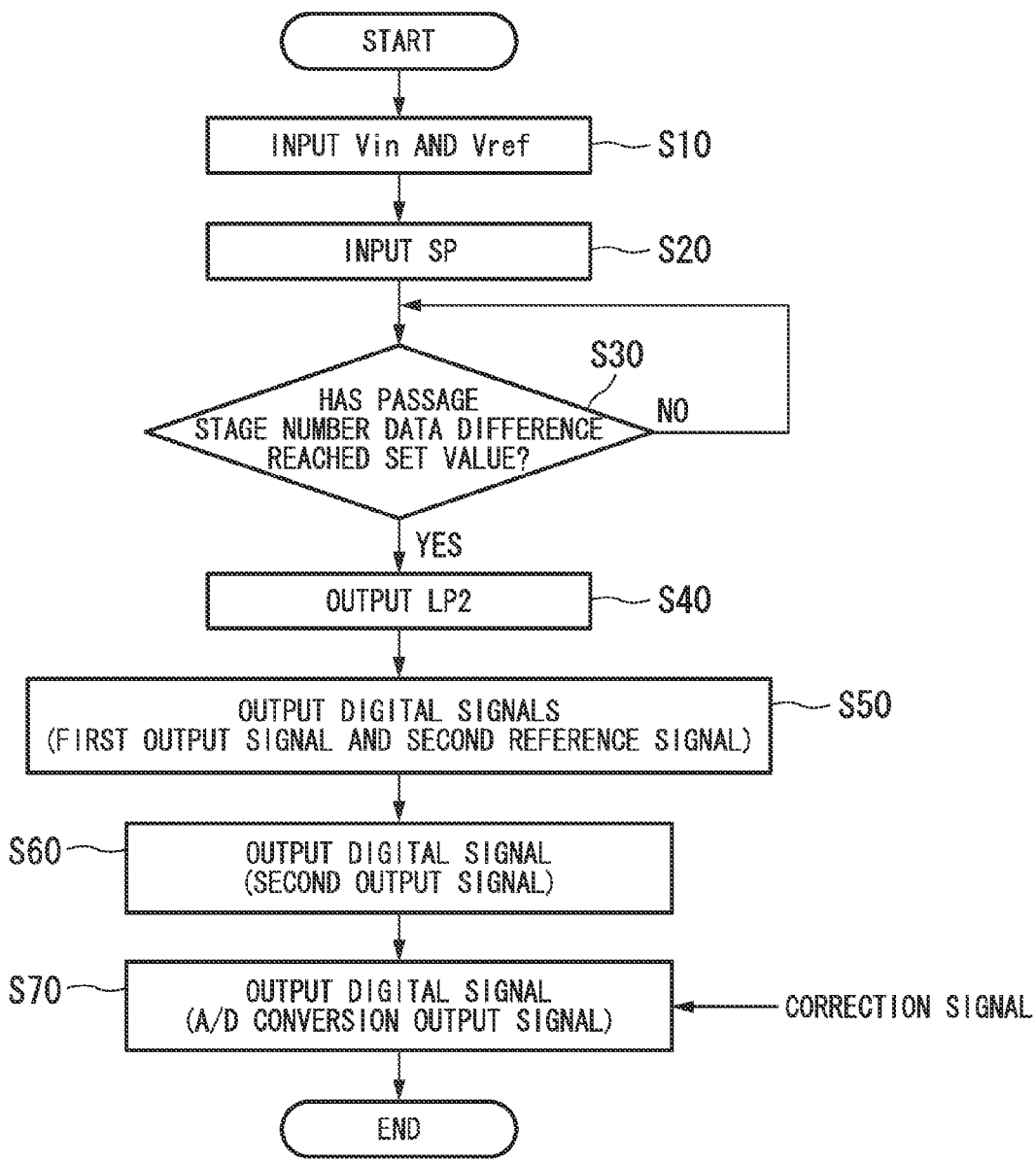
FIG. 6 is a flowchart showing a processing procedure in the correction signal generator according to an embodiment of the present invention.

Next, a processing procedure of the A/D converter will be described. FIG. 6 is a flowchart showing a processing procedure in the A/D converter 200 according to this embodiment. A correction signal is output from the correction signal generator 100 in a processing procedure of the A/D converter 200 according to this embodiment, but a processing procedure of the correction signal generator 100 is the same as that described using FIG. 2 in the first embodiment and therefore description thereof is omitted in this embodiment.

First, in step S10, the analog input voltage Vin is input to the pulse delay circuit 81. The analog reference voltage Vref is input to the pulse delay circuit 91 and the timer circuit 12. Thereby, the analog reference voltage Vref is input to the pulse delay circuit 124 and the level shift circuit 121. The level shift reference voltage Vref−ΔVref obtained by level-shifting the analog input voltage Vref by the prescribed fixed small voltage value ΔVref (only ΔVref=ΔVin) is input to the pulse delay circuit 122.

Subsequently, in step S20, the circulation pulse SP is input to the pulse delay circuits 81, 91, 122, and 124. Thereby, the circulation pulse SP circulates within the delay units in different delay times in the pulse delay circuits 81, 91, 122, and 124 (or in a delay time corresponding to a voltage level of the analog input voltage Vin in the pulse delay circuit 81, a delay time corresponding to a voltage level of the analog reference voltage Vref in the pulse delay circuits 91 and 124, and a delay time corresponding to a voltage level of the level shift reference voltage Vref−ΔVref in the pulse delay circuit 122). The pulse passage stage number detection circuits 82, 92, 123, and 125 detect the number of stages of delay units through which the circulation pulse SP has passed, and output detection results as the fourth, fifth, sixth, and seventh passage stage number data, respectively.

Subsequently, in step S30, the output stage number comparison circuit 126 compares a difference (passage delay-unit stage number difference) between the sixth passage stage number data and the seventh passage stage number data output from the pulse passage stage number detection circuits 123 and 125, and determines whether or not the difference has reached a preset value (set value). If the passage stage number data difference has reached the set value (the same value as the passage delay-unit stage number difference passage the output stage number comparison circuit 41), the output stage number comparison circuit 126 outputs a latch pulse LP2 for enabling the latch and encoder 83 to latch the fourth passage stage number data and enabling the latch and encoder 93 to latch the fifth passage stage number data in step S40. If the passage stage number data difference does not reach the set value, step S30 is iterated.

Subsequently, in step S50, the latch and encoder 83 latches the fourth passage stage number data according to the latch pulse LP2 input from the output stage number comparison circuit 126, encodes the fourth passage stage number data into a 12-bit first output signal Cout1, and outputs the 12-bit first output signal. Also, in step S50, the latch and encoder 93 latches the fifth passage stage number data according to the latch pulse LP2 input from the output stage number comparison circuit 126, encodes the fifth passage stage number data into a 12-bit second reference signal, and outputs the 12-bit second reference signal.

Subsequently, in step S60, the output circuit 10 outputs a 12-bit second output signal obtained by subtracting the second reference signal output from the latch and encoder 93 from the first output signal Cout1 output from the latch and encoder 83.

Subsequently, in step S70, the correction circuit 11 averages the second output signal output from the output circuit 10 and the correction signal output from the correction signal generator 100 and outputs a final 12-bit A/D conversion output signal into which the A/D converter 200 performs a digital conversion. The processing is then completed.

Figure 7:
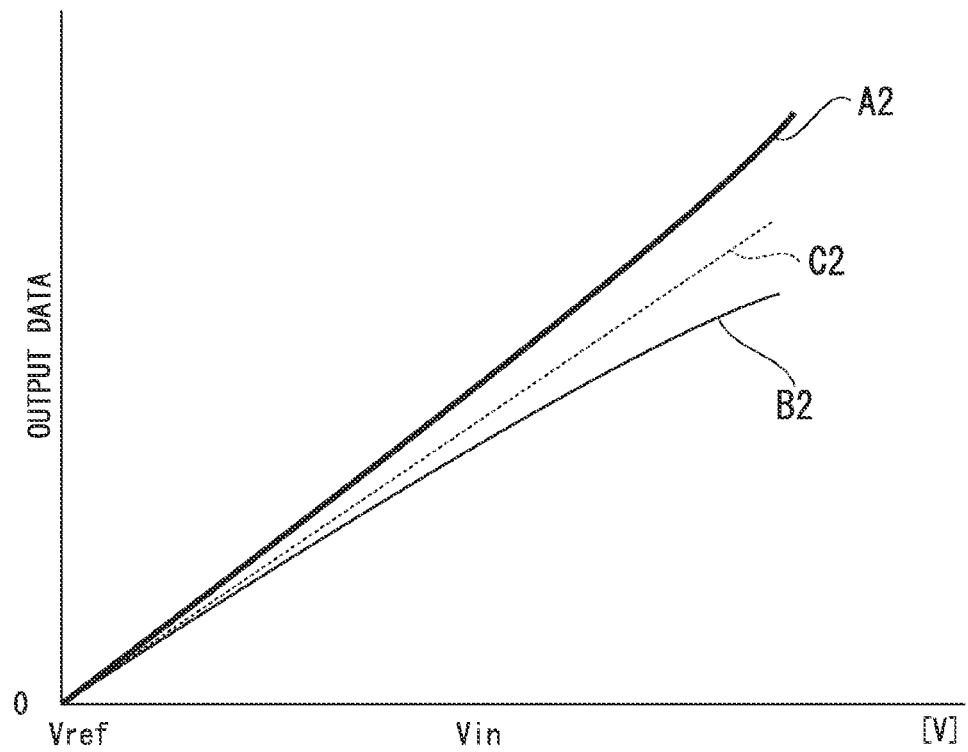
FIG. 7 is a graph showing an example of input/output characteristics of the A/D converter according to an embodiment of the present invention.

Next, the input/output characteristics of the A/D converter according to the above-described configuration will be described. FIG. 7 is a graph showing an example of the input/output characteristics of the A/D converter 200 according to this embodiment and an example of the input/output characteristics of the A/D converter 300 before a correction in the related art shown in FIG. 9. In FIG. 7, an X axis represents an analog input voltage Vin, and a Y axis represents a digital signal output from the A/D converter 200. In FIG. 7, a curve "A2" represents the input/output characteristics (correction signal) of the correction signal generator 100, and a curve "B2" represents the output characteristics (second output signal) of the output circuit 10 to the analog input voltage Vin. A straight line "C2" shown in FIG. 7 represents the output characteristics of the correction circuit 11 to the analog input voltage Vin, that is, the input/output characteristics of the A/D converter 200 according to this embodiment.

The curve "B2" is the same as a digital value based on the origin which is the digital value Cout into which the A/D converter 300 of the related art shown in FIG. 9 performs a digital conversion, but the reason is as follows.

Because the analog reference voltage Vref is fixed and a voltage level difference ΔVref between the analog reference voltage Vref and the level shift reference voltage Vref–ΔVref is fixed, the timing when a difference in the number of stages of delay units through which the circulation pulse SP circulating within the pulse delay circuit 124 and the pulse delay circuit 122 has passed becomes a preset value is fixed. Thereby, like the latch pulse LP input at a fixed timing in the A/D converter 300 of the related art, the latch pulse LP2 is output at a fixed timing. Accordingly, a change in a slope of a curve representing the output characteristics of the stage number detection circuit 8 to the analog input voltage Vin is similar to a change in a slope of a curve representing the input/output characteristics of the A/D converter 300 of the related art. Consequently, the output characteristics of the output circuit 10 to the analog input voltage Vin are based on the origin which is the input/output characteristics of the A/D converter 300 of the related art.

Figure 8:
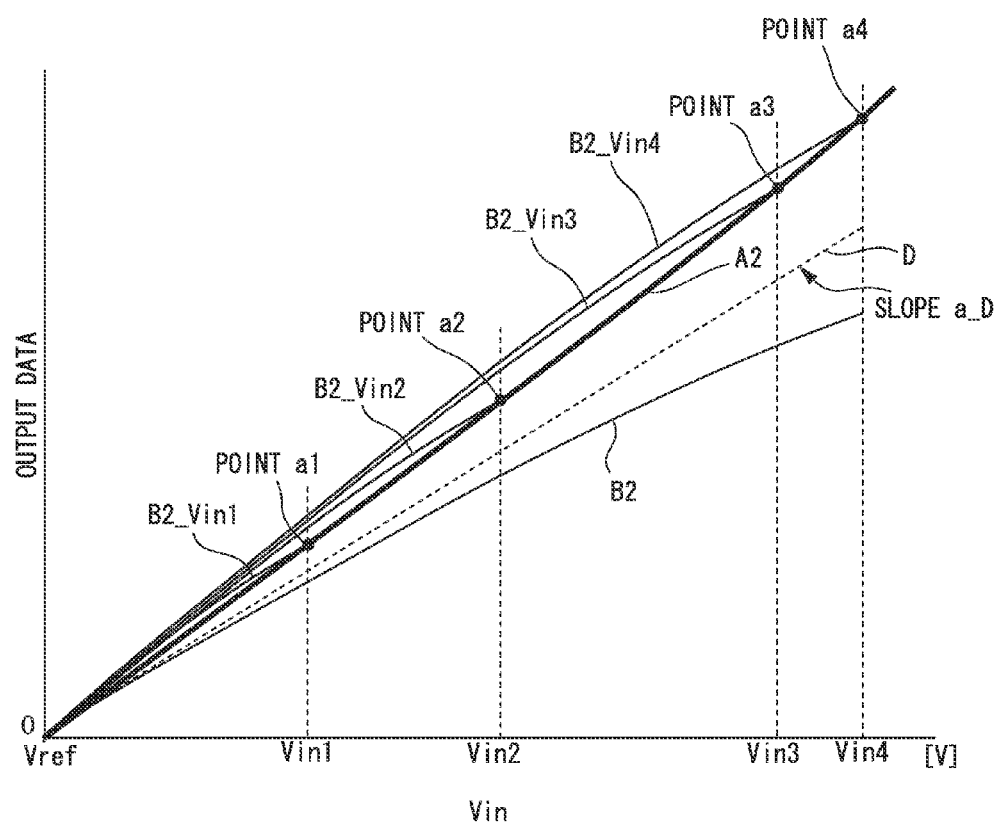
FIG. 8 is a graph showing a detailed example of input/output characteristics of the A/D converter according to an embodiment of the present invention.

Next, the correction signal indicated by the curve "A2" will be described in further detail using FIG. 8. In FIG. 8, a straight line D has a fixed slope a_D (ΔCout/ΔVin). A curve "B2_Vin4" represents the input/output characteristics when a sampling time of the second output signal is a time when a slope is a_D at the analog input voltage Vin=Vin4. Likewise, a curve "B2_Vin3" represents the input/output characteristics when the sampling time of the second output signal is a time when the slope is a_D at the analog input voltage Vin=Vin3, a curve "B2_Vin2" represents the input/output characteristics when the sampling time of the second output signal is a time when the slope is a_D at the analog input voltage Vin=Vin2, and a curve "B2_Vin1" represents the input/output characteristics when the sampling time of the second output signal is a time when the slope is a_D at the analog input voltage Vin=Vin 1.

That is, the input/output characteristics of the correction signal generator 100 become a curve as shown in the curve "A2" passing through the origin, a point a1 at which the analog input voltage Vin=Vin1 in the curve "B2_Vin1," a point a2 at which the analog input voltage Vin=Vin2 in the curve "B2_Vin2," a point a3 at which the analog input voltage Vin=Vin3 in the curve "B2_Vin3," and a point a4 at which the analog input voltage Vin=Vin4 in the curve "B2_Vin4."

From this, the A/D converter 200 can obtain the input/output characteristics having a good linearity by averaging the second output signal based on the origin which is the input/output characteristics of the A/D converter 300 of the related art and the correction signal having the input/output characteristics having a curvature direction opposite to that of the second output signal.

In the A/D converter 200 of this embodiment, the analog reference voltage Vref has the same voltage level in all circuits. Thereby, the analog reference voltage Vref input to the pulse delay circuit 91 within the stage number detection circuit 9 has the same voltage level as the analog reference voltage Vref input to the pulse delay circuit 51 within the correction signal generator 100. As a result, as shown in FIG. 7, the curve "B2" representing the second output signal output from the output circuit 10 and the curve "A2" representing the correction signal output from the correction signal generator 100 intersect at the origin at which output data becomes "0" when the analog input voltage Vin has the same voltage level as the analog reference voltage Vref.

From the above, it is possible to obtain a result of input/output characteristics close to an ideal straight line required for the A/D converter as shown in the straight line "C2" by averaging the curve "A2" and the curve "B2" shown in FIG. 7 in the correction circuit 11.

The straight line "C2" obtained by averaging the curve "A2" and the curve "B2" shown in FIG. 7 has the input/output characteristics passing through the origin. It can be said that the straight line "C2" indicates a digital signal output value after an A/D conversion for the analog input voltage Vin by an absolute value.

In an example in which a digital value Cout output from the A/D converter 300 of the related art is corrected, for example, using the correction signal output from the correction signal generator 100, input/output characteristics not passing through the origin are the input/output characteristics as in the straight line "C1" shown in FIG. 3. That is, because there is no reference value for an input signal in the straight line "C1," a digital signal output value can be expressed only by a relative result indicating that a relationship between one specific digital signal output value and the other digital signal output value is a difference between two digital signal output values.

On the other hand, in the A/D converter 200 of this embodiment, the digital signal output value can be specified by an absolute value on the basis of a voltage level of the analog reference voltage Vref. If the voltage level of the analog input voltage Vin is equal to the voltage level of the analog reference voltage Vref (in the origin in FIG. 7), the timing when the latch pulse LP is output by the output stage number comparison circuit 41 within the correction signal generator 100 is equal to the timing when the latch pulse LP2 is output by the output stage number comparison circuit 126 within the timer circuit 12. This is because a voltage ΔVin by which the level shift circuit 2 within the correction signal generator 100 shifts a level has the same prescribed voltage value as a voltage ΔVref by which the level shift circuit 121 within the timer circuit 12 shifts a level, and latch-pulse output circuits therefore are the same as each other. As a result, this is because the detection signal and the first output signal Cout1 output from the correction signal generator 100 become digital signals having the same value.

Furthermore, because a circuit obtained by combining the stage number detection circuit 5 and the reference signal output circuit 43 for outputting a reference signal within the correction signal generator 100 is the same as the stage number detection circuit 9 and input analog reference voltages Vref are also the same, the reference signal within the correction signal generator 100 and the second reference signal are digital signals having the same value.

As a result, if the voltage level of the analog input voltage Vin is equal to that of the analog reference voltage Vref, the correction signal output from the correction signal generator 100 (the curve "A2" shown in FIG. 7) and the second output signal output from the output circuit 10 (the curve "B2" shown in FIG. 7) are digital signals having the same value.

From this, as seen from FIG. 7, the slopes of the curve "B2" and the curve "A2" are substantially identical in a region where the analog input voltage Vin and the analog reference voltage Vref are substantially identical, that is, in a region where the analog input voltage Vin has a voltage level close to the origin shown in FIG. 7. The slopes of the curve "B2" and the curve "A2" are away from the straight line "C2" as the curves are apart from the origin.

Thereby, the input/output characteristics of the A/D converter after a correction in which the curve "B2" and the curve "A2" are averaged is closer to C2 and the linearity is further improved.

According to the A/D converter of this embodiment as described above, it is possible to correct a digital signal output value after an A/D conversion to be output using the correction signal when an analog input voltage is converted into digital data using a pulse delay circuit, which delays a circulation pulse by a delay time corresponding to a magnitude of an analog input voltage, thereby implementing the A/D converter having input/output characteristics with a good linearity.

As described above, according to the embodiment of the present invention, it is possible to provide a correction signal generator capable of easily performing a correction without complex settings for actually performing A/D conversions for a plurality of reference voltages so as to perform straight-line approximation for the input/output characteristics since the correction signal generator can generate a correction signal for correcting a curvature (non-linearity) of input/output characteristics of the related art.

It is possible to provide an A/D converter capable of obtaining input/output characteristics close to an ideal straight line by embedding the correction signal generator in the A/D converter and correcting a digital signal output value after an A/D conversion on the basis of a generated correction signal.

A circuit configuration in which circuits overlapping the correction signal generator of the first embodiment, for example, such as the stage number detection circuit 1 within the correction signal generator 100 and a combination of the pulse delay circuit 81 and the pulse passage stage number detection circuit 82 or the stage number detection circuit 5 within the correction signal generator 100 and a combination of the pulse delay circuit 91 and the pulse passage stage number detection circuit 92 within the A/D converter 200, are not used in common has been described in the circuit configuration of the A/D converter of the second embodiment. However, it is possible to reduce a circuit scale of the A/D converter 200 by using the overlapping circuits in common.

A circuit configuration in which overlapping circuits, for example, such as a combination of the pulse delay circuit 91 and the pulse passage stage number detection circuit 92 and a combination of the pulse delay circuit 124 and the pulse passage stage number detection circuit 125, are also not used in common has been described as an internal circuit configuration of the A/D converter of the second embodiment. However, it is possible to further reduce a circuit scale of the A/D converter 200 by using the overlapping circuits in common.

While preferred embodiments of the present invention have been described and illustrated above, it should be understood that these are exemplary of the invention and are not to be considered as limiting. Additions, omissions, substitutions, and other modifications can be made without departing from the scope of the present invention.

The terms of degree such as "substantially," "about," "nearly", and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

The present invention can provide a correction signal generator for generating a correction signal for correcting a curvature (non-linearity) of input/output characteristics of an A/D converter.

What is claimed is:

1. A correction signal generator that generates a correction signal that corrects a digital signal obtained from an analog input voltage, the correction signal generator comprising:

a first stage number detection circuit including a first pulse delay circuit and a first pulse passage stage number detection circuit, a plurality of stages of delay units each of which delays a first pulse signal by a delay time corresponding to a magnitude of the analog input voltage being connected in the first pulse delay circuit, the first pulse passage stage number detection circuit detecting the number of stages of delay units in the first pulse delay circuit through which the first pulse signal has passed;

a level shift circuit configured to output an analog voltage obtained by shifting a voltage level of the analog input voltage;

a second stage number detection circuit including a second pulse delay circuit and a second pulse passage stage number detection circuit, a plurality of stages of delay units that delays a second pulse signal by a delay time corresponding to a magnitude of the analog voltage with the voltage level shifted by the level shift circuit being connected in the second pulse delay circuit, the second pulse passage stage number detection circuit detecting the number of stages of delay units in the second pulse delay circuit through which the second pulse signal has passed;

a third stage number detection circuit including a third pulse delay circuit and a third pulse passage stage number detection circuit, a plurality of stages of delay units that delays a third pulse signal by a delay time corresponding to a magnitude of a first analog reference voltage, which is a first prescribed voltage value, being connected in the third pulse delay circuit, the third pulse passage stage number detection circuit detecting the number of stages of delay units in the third pulse delay circuit through which the third pulse signal has passed; and a correction signal output circuit configured to retain the number of passage stages of delay units detected by the first stage number detection circuit and the third stage number detection circuit at a timing corresponding to a stage number difference between the number of passage stages of delay units detected by the first stage number detection circuit and the number of passage stages of delay units detected by the second stage number detection circuit, the correction signal output circuit outputting a difference between the number of stages from the first stage number detection circuit and the number of stages from the third stage number detection circuit retained as a correction signal.

2. The correction signal generator according to claim 1, wherein the correction signal output circuit retains the number of stages of delay units detected by the first stage number detection circuit at a timing when the stage number difference between the number of passage stages of delay units detected by the first stage number detection circuit and the number of passage stages of delay units detected by the second stage number detection circuit becomes a prescribed stage number difference.

3. An analog-to-digital (A/D) converter that converts an analog input voltage into a digital signal, the A/D converter comprising:

a fourth stage number detection circuit including a fourth pulse delay circuit and a fourth pulse passage stage number detection circuit, a plurality of stages of delay units that delays a fourth pulse signal by a delay time corresponding to a magnitude of the analog input voltage being connected in the fourth pulse delay circuit, the fourth pulse passage stage number detection circuit detecting the number of stages of delay units in the fourth pulse delay circuit through which the fourth pulse signal has passed in a predetermined time;

a fifth stage number detection circuit including a fifth pulse delay circuit and a fifth pulse passage stage number detection circuit, a plurality of stages of delay units that delays a fifth pulse signal by a delay time corresponding to a magnitude of a second analog reference voltage, which is a prescribed second voltage value, being connected in the fifth pulse delay circuit, the fifth pulse passage stage number detection circuit detecting the number of stages of delay units in the fifth pulse delay circuit through which the fifth pulse signal has passed in the predetermined time;

an output circuit configured to subtract the number of passage stages of delay units detected by the fifth stage number detection circuit from the number of passage stages of delay units detected by the fourth stage number detection unit, the output circuit outputting a subtraction result of the number of passage stages of delay units as a digital signal;

the correction signal generator according to claim 1; and a correction circuit configured to correct a digital signal output from the output circuit based on the correction signal output from the correction signal generator and outputting the corrected digital signal.

4. The A/D converter according to claim 3, wherein the correction circuit averages the correction signal output from the correction signal generator and the digital signal output from the output circuit, and outputs an averaged digital signal.

5. The A/D converter according to claim 3, wherein the second analog reference voltage is equal to the first analog reference voltage.

6. The A/D converter according to claim 3, further comprising:

a timer circuit configured to set the predetermined time so that the number of passage stages of delay units detected by the fifth stage number detection circuit is substantially equal to the number of stages from the third stage number detection circuit retained by the correction signal output circuit if the second analog reference voltage is equal to the first analog reference voltage and the analog input voltage.

* * * * *